(12) United States Patent
Karri et al.

(10) Patent No.: US 11,942,866 B2
(45) Date of Patent: Mar. 26, 2024

(54) TRANSCONDUCTANCE AMPLIFIER FOR BUCK-BOOST CONVERTER

(71) Applicant: Cypress Semiconductor Corporation, San Jose, CA (US)

(72) Inventors: Rajesh Karri, Visakhapatnam (IN); Arun Khamesra, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 453 days.

(21) Appl. No.: 17/381,679

(22) Filed: Jul. 21, 2021

(65) Prior Publication Data

US 2022/0069711 A1    Mar. 3, 2022

Related U.S. Application Data

(60) Provisional application No. 63/074,060, filed on Sep. 3, 2020.

(51) Int. Cl.
| | |
|---|---|
| *H03F 1/02* | (2006.01) |
| *G06F 13/42* | (2006.01) |
| *H02M 3/158* | (2006.01) |
| *H03F 1/30* | (2006.01) |

(52) U.S. Cl.
CPC ...... *H02M 3/1582* (2013.01); *G06F 13/4282* (2013.01); *H03F 1/0227* (2013.01); *H03F 1/301* (2013.01); *H03F 2200/351* (2013.01); *H03F 2200/462* (2013.01)

(58) Field of Classification Search
CPC .... H02M 3/1582; H02M 1/08; H02M 1/0009; H02M 1/0016; H02M 1/0019; H02M 1/0025; G06F 13/4282; H03F 1/0227; H03F 1/301; H03F 2200/351; H03F 2200/462; H03F 2200/447; H03F 3/45475; H03F 3/45596; H03F 3/68; H03F 1/30
USPC ........................................ 330/297, 136, 10
See application file for complete search history.

(56) References Cited

U.S. PATENT DOCUMENTS

| | | | | |
|---|---|---|---|---|
| 9,564,772 | B2 * | 2/2017 | Qiu | .......................... H02J 7/04 |
| 11,245,332 | B1 * | 2/2022 | Houston | ................. H02M 1/32 |

* cited by examiner

*Primary Examiner* — Hieu P Nguyen

(57) ABSTRACT

An error amplifier includes an output pin coupled to a pulse width modulation (PWM) comparator of a buck-boost converter. A first transconductance amplifier adjusts an output current at the output pin and operates in a constant voltage mode. The first transconductance amplifier includes a first positive input to receive a first voltage reference and a first negative input coupled to a tap point of a voltage divider coupled between a voltage bus and a ground of the buck-boost converter. A second transconductance amplifier also adjusts the output current at the output pin and operates in a constant current mode. The second transconductance amplifier includes a second positive input to receive a second voltage reference and a second negative input coupled to a current sense amplifier, the current sense amplifier being coupled to a sense resistor positioned inline along the voltage bus.

20 Claims, 10 Drawing Sheets

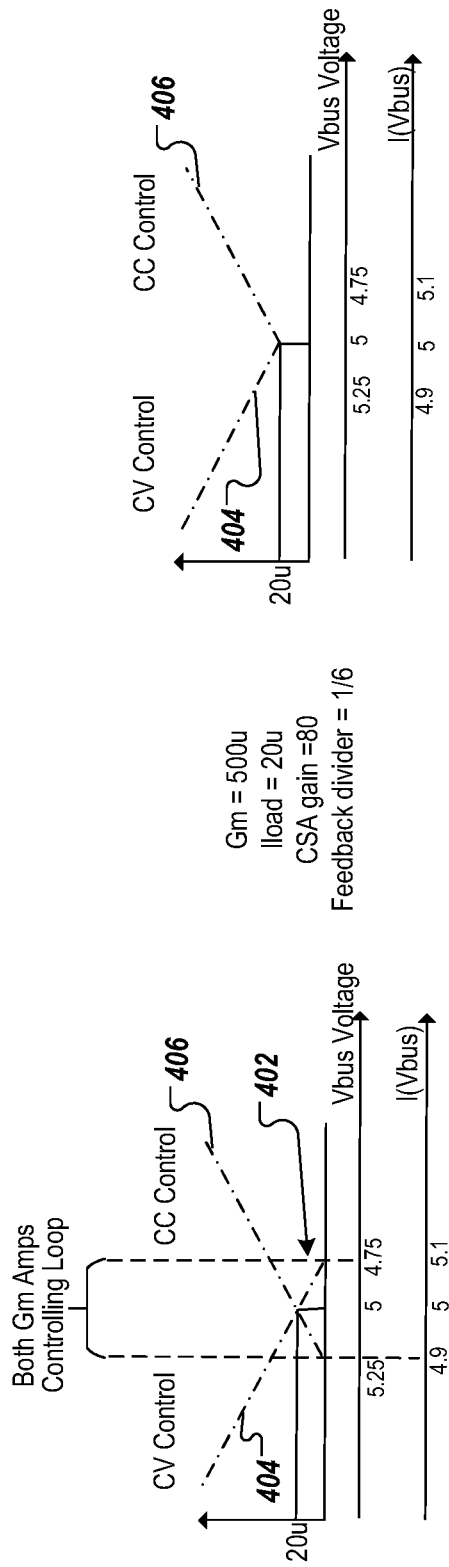

TRANSCONDUCTANCE AMPLIFIER FOR BUCK-BOOST CONVERTER

RELATED APPLICATIONS

This application claims the benefit of U.S. Provisional Patent Application No. 63/074,060, filed on Sep. 3, 2020, the entire contents of which is incorporated herein by this reference.

TECHNICAL FIELD

This disclosure relates to integrated circuits (ICs) that control Universal Serial Bus (USB) power delivery to electronic devices.

BACKGROUND

Various electronic devices (e.g., such as smartphones, tablets, notebook computers, laptop computers, chargers, adapters, power banks, etc.) are configured to transfer power through USB connectors according to USB power delivery protocols defined in various versions and revisions of the USB Power Delivery (USB-PD) specification. For example, in some applications an electronic device may be configured as a power consumer to receive power through a USB connector (e.g., for battery charging), while in other applications an electronic device may be configured as a power provider to provide power to another device that is connected thereto through a USB connector. In various applications, electronic manufacturers may also use power converters (e.g., such as buck-boost converters) that need to meet various USB-PD specification requirements such as, for example, requirements for output voltage (Vout) monotonicity, bandwidth, and stability.

BRIEF DESCRIPTION OF THE DRAWINGS

FIG. 4A is a graph illustrating an overlap region for a constant voltage and constant current feedback control loops according to at an embodiment.

FIG. 4B is a graph illustrating elimination of the overlap region using a minimum current generator of the error amplifier that sources a minimum current back to a common error amplifier node according to an embodiment.

DETAILED DESCRIPTION

Figure 1:
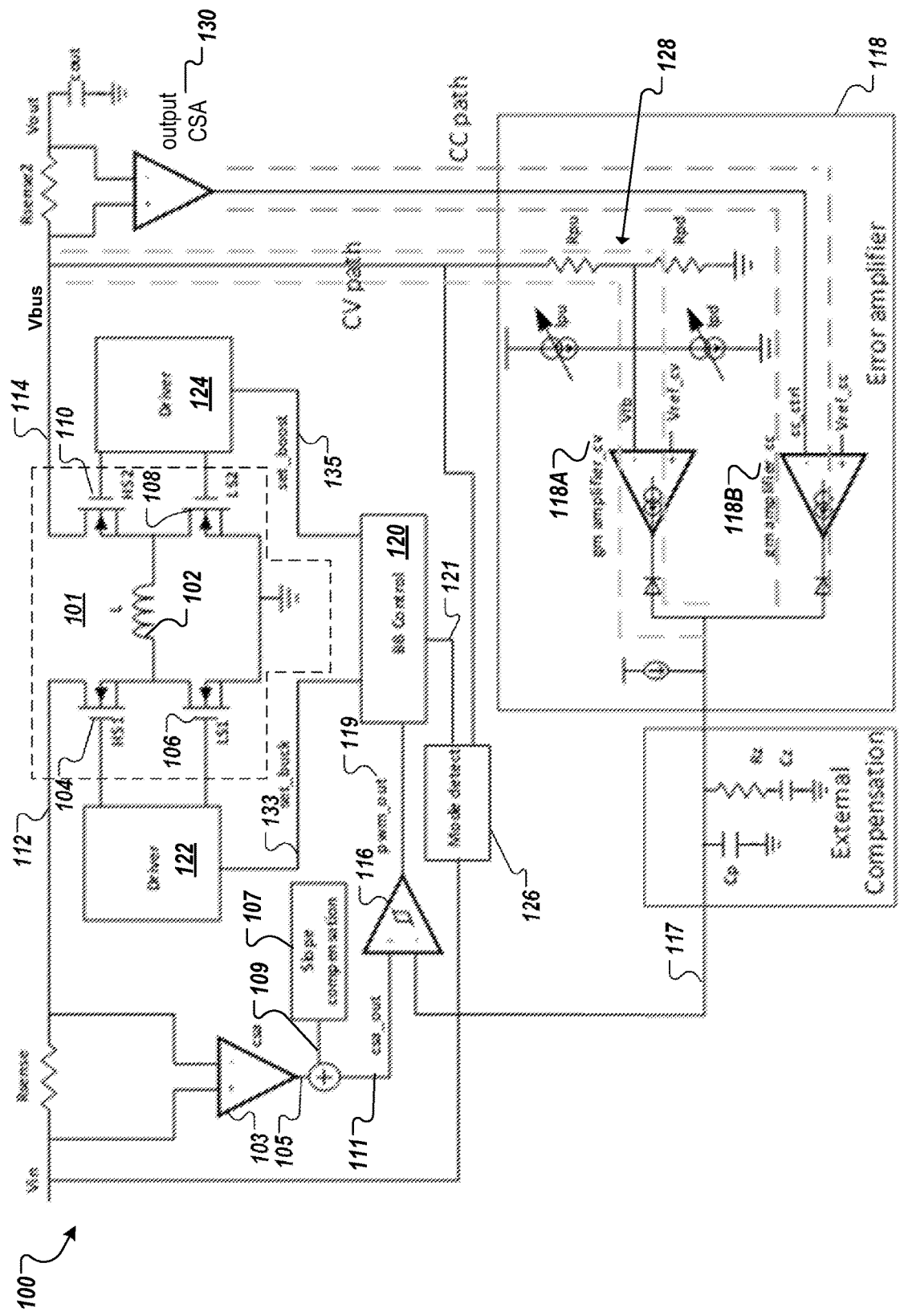
FIG. 1 is a schematic block diagram of a USB controller that includes a buck-boost converter architecture according to at least one embodiment.

The following description sets forth numerous specific details such as examples of specific systems, components, methods, and so forth, in order to provide a good understanding of various embodiments of transconductance amplifiers for buck-boost converters within USB Type-C controllers (or other related converters) as described herein. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of an error amplifier to control pulse-width modulation (PWM) control of buck-boost converters for USB Type-C controllers that can be disposed to operate in various electronic devices. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., cables, hubs, docking stations, adapters, chargers, etc.), audio/video/data recording and/or playback devices (e.g., cameras, voice recorders, hand-held scanners, monitors, etc.), and other similar electronic devices that can use USB interfaces for communication, battery charging, and/or power delivery.

As used herein, "USB-enabled" device or system refers to a device or system that includes, is configured with, or is otherwise associated with a USB connector interface. A USB-enabled electronic device may comply with at least one release of a Universal Serial Bus (USB) specification. Examples of such USB specifications include, without limitation, the USB Specification Revision 2.0, the USB 3.0 Specification, the USB 3.1 Specification, the USB 3.2 Specification and/or various supplements, versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C (also referred to herein as "USB-C"), is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX− lines, among others. In addition, a Type-C port also provides a Sideband Use (denoted SBU) line for signaling of sideband functionality and a Configuration Channel (or communication channel, denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc. As used herein, "USB-PD subsystem" refers to one or more logic blocks and other analog/digital hardware circuitry, which may be controllable by firmware in an IC controller and which is configured and operable to perform the functions and to satisfy the requirements specified in at least one release of the USB-PD specification. The IC controller can be implemented in a USB Type-C device. The IC controller can be implemented in a USB device.

Power delivery in accordance with the USB-PD specification(s) can be embodied in several different types of USB Type-C applications. Examples of such types of Type-C applications include, but may not be limited to: a downstream facing port (DFP) application, in which an IC controller with a USB-PD subsystem is configured to provide a downstream-facing USB port (e.g., in a USB-enabled host device); an upstream facing port (UFP) application, in which an IC controller with a USB-PD subsystem is configured to provide an upstream-facing USB port (e.g., in a USB-enabled peripheral device or adapter); a dual role port (DRP) USB application, in which an IC controller with a USB-PD subsystem is configured to support both DFP and UFP applications on the same USB port (e.g., a USB Type-C port that is configured to operate as either a power provider or a power consumer or can alternate between these two roles dynamically by using USB-PD power role swap); and an active cable application, in which an IC controller with a USB-PD subsystem is disposed into, and configured to operate, an electronically marked cable assembly (EMCA) Type-C cable.

A USB-C/PD power supply can be used to deliver power with a wide output voltage range of 3.3V-21.5V, a wide current range of 1 A-5 A, and a wide input supply voltage range of 5.0V to 24V, as per USB-C/PD protocol. Due to this wide voltage/current range for USB-C power delivery and rapid switching requirements between input and output voltage signals, a buck-boost (BB) converter can be employed within a USB Type-C controller, which can be controlled to provide power to expected output loads.

FIG. 1 is a schematic block diagram of a USB controller 100 that includes a buck-boost (BB) converter architecture according to at least one embodiment. The USB controller 100 includes a buck-boost (BB) converter 101 in at least one embodiment. Although illustrated deployed within the USB controller 100, the present BB architecture can be employed in other BB applications and contexts where a transconductance amplifier is used, such as, for example, a buck converter, a boost converter, or a BB converter.

In various embodiments, the BB converter 101 includes an inductor 102, a first high-side switch 104 (or HS1), a second high-side switch 110 (or HS2), a first low-side switch 106 (or LS1), and a second low-side switch 108 (or LS2). In one embodiment, these switches are n-type field effect transistors (NFETs), as illustrated. In another embodiment, although not illustrated, the high side switches are p-channel field effect transistors (PFETs). In various embodiments, the first high-side switch 104 is coupled between an input terminal 112 and a first side of the inductor 102 of the BB converter 101. The high-side switch 110 is coupled between a second side of the inductor 102 and an output terminal 114. The first low-side switch 106 is coupled between the first side of the inductor 102 and a ground of the BB converter 101. The second low-side switch 108 is coupled between the second side of the inductor and the ground. The input terminal 112 can carry an input voltage (Vin) and the output terminal can carry an output voltage (Vout) of the BB converter 101. The BB converter 101 can further include an input capacitor (Cin) coupled to the input terminal 112 and an output capacitor (Cout) coupled to the output terminal 114.

For such a BB converter 101, the input capacitor (Cin), output capacitor (Cout), and the inductor 102 can be designed based on input, output, and load current requirements. In various embodiments, the design of the BB converter 101 (or a larger system or device that includes the BB converter 101) seeks to limit the maximum current to a certain amperage and wattage requirement. Once total output power range is known, one can determine input current requirements. From input current requirements, one can determine values for capacitance of the input and output capacitors (Cin and Cout) and for the inductance of the inductor 102.

In various embodiments, the USB controller 100 further includes a current sense amplifier (CSA) 103, a comparator 116, an error amplifier (EA) 118, BB control logic 120, a driver 122, a driver 124, and mode detect logic 126. The CSA 103 can measure an input current of the buck-boost converter 101 and can output a CSA signal 105 indicative of the input current. A slope compensation circuit 107, which can include slope compensation logic and a slope compensation capacitor, is coupled to an output of CSA 103. Slope compensation circuit 107 can add an offset signal 109 (slope compensation offset) to CSA signal 105 when enabled, generating an offset CSA signal 111. In some cases, the offset signal 109 is a current or a charge. In other cases, the offset signal 109 can be a voltage signal if other circuits are used to add the offset signal 109 to CSA signal 105.

In some embodiments, an error amplifier (EA), such as the EA 118, can have a closed loop voltage mode architecture, which requires two additional pins and doubles the components on board for compensation, or has an open-loop transconductance (Gm) amplifier architecture. To minimize sizes of the inductor, capacitor, and other board components, generally a high-bandwidth buck-boost converter is used, where generally, the bandwidth is approximately one-tenth to one-fifth of the switching frequency of the device. Thus, a high-bandwidth buck-boost converter requires a high-bandwidth EA architecture. Designing a higher bandwidth voltage mode amplifier increases the design complexity. Hence, a Gm amplifier architecture is generally used in the buck-boost converter 101. A Gm amplifier works on the principle of delivering output current proportional to the input voltage difference. This creates an offset at the input of the amplifier.

In various embodiments, the BB converter 101 can work in either constant voltage or constant current mode depending on the load conditions. Having a separate compensation node for each of these modes will complicate the design of PWM and register transfer level (RTL), where RTL is used to indicate the digital portion of a chip design. A single compensation point can be used for both modes, but doing so creates at least the following issues, including inaccuracy in Vbus regulation, overlap of the CV/CC control regions, and lower saturation source current. For the former, as the compensation node is shared between both CV and CC amplifiers, there needs to be an offset at the input of the EA 118 for sinking the fixed load current (Iout=gm(vref−vfb)). Variation of Gm with temperature causes this offset to change resulting in poor Vbus regulation with temperature.

Further, when the USB controller 100 is near the CV-CC border region, based on the Gm and the source current, there is an overlap region where both the constant voltage and constant current Gm amplifiers will start to control the loop and the EA 118 is neither in CV loop, nor in CC loop, as illustrated in FIG. 4A. To limit the offset at the input and the overlap of CV/CC loop, the source current can be minimized, which results in early saturation of the amplifier, degrading the transient response. The below various design enhancements of the EA 118 resolves these deficiencies in ways that will be discussed throughout discussion of the various Figures.

In at least one embodiment, the comparator 116 receives the CSA signal 111 and an EA signal 117 from the EA 118. The EA 118 can include a pair of transconductance (Gm) amplifiers, a first (or constant voltage) transconductance amplifier 118A and a second (or constant current) transconductance amplifier 118B. The first transconductance amplifier 118A can operate in a constant voltage mode using the voltage tapped off of the voltage bus (Vbus) output of the BB converter 101. For example, the first transconductance amplifier 118A can adjust an output current of the EA signal 117 based on a difference between first positive and negative inputs. The first positive input can receive a first voltage reference (Vref_cv), e.g., related to a target constant voltage, and the first negative input can be coupled to a tap point of a voltage divider 128 coupled between the Vbus and ground. The tap point provides a feedback constant voltage value (Vfb) from the Vbus. This current flowing into the first negative input can be tuned by sourcing current from a variable current source (Ipu) or sinking current to a variable current sink (Ipd). These Ipu and Ipd current sources change the feedback current at the input of the first transconductance amplifier 118A, which will help change the Vbus voltage and thus meeting USB bus specifications of between 3V and 21V.

In this at least one embodiment, the second transconductance amplifier 118B can operate in a constant current mode using current sensed from the voltage bus (Vbus). For example, the second transconductance amplifier 118B can adjust the output current of the EA signal 117 based on a difference between second positive and negative inputs. The second positive input can receive a second reference voltage (Vref_cc), e.g., related to a target constant current, and the second negative input can be coupled to an output current sense amplifier (CSA) 130. The output CSA 130 is coupled to a second sense resistor positioned inline along the voltage bus (Vbus), to sense the current of the Vbus.

The comparator 116 compares the CSA signal 111 and the EA signal 117 and provides a control signal 119, referred to as pulse width modulation (PWM) out (or pwm_out) signal, to the BB control logic 120. In one embodiment, the EA control loop as referred to herein refers to at least the constant voltage (CV) and constant current (CC) paths, the EA 118, the CSA 103, and the comparator 116 that adjusts the PWM output signal to the BB control logic 120 based on the input voltage (Vin), the output voltage (Vout or Vbus), and the reference voltages (Vref_cv and Vref_cc), the latter of which are programmable.

In various embodiments, the BB control logic 120 receives the control signal 119 and a mode signal 121 from mode detect logic 126. The mode detect logic 126 can determine a mode and a transition between modes based on the output voltage (Vout) and the input voltage (Vin), and outputs the mode signal 121 accordingly. In various embodiments, if Vin is higher than Vout, the mode detect logic 126 will output the mode signal 121 indicative of buck mode. In contrast, if Vout is higher than Vin, the mode detect logic 126 will output the mode signal 121 indicative of boost mode.

The BB control logic 120 can use the control signal 119 and the mode signal 121 to control a mode of the buck-boost converter 101. In particular, the BB control logic 120 can send a first control signal 133 (set_buck) to the driver 122 that controls the first high-side switch 104 and the first low-side switch 106 of the buck-boost converter 101. The BB control logic 120 can further send a second control signal 135 (set_boost) to the driver 124 that controls the second high-side switch 110 and the second low-side switch 108 of buck-boost converter 101.

Figure 2:
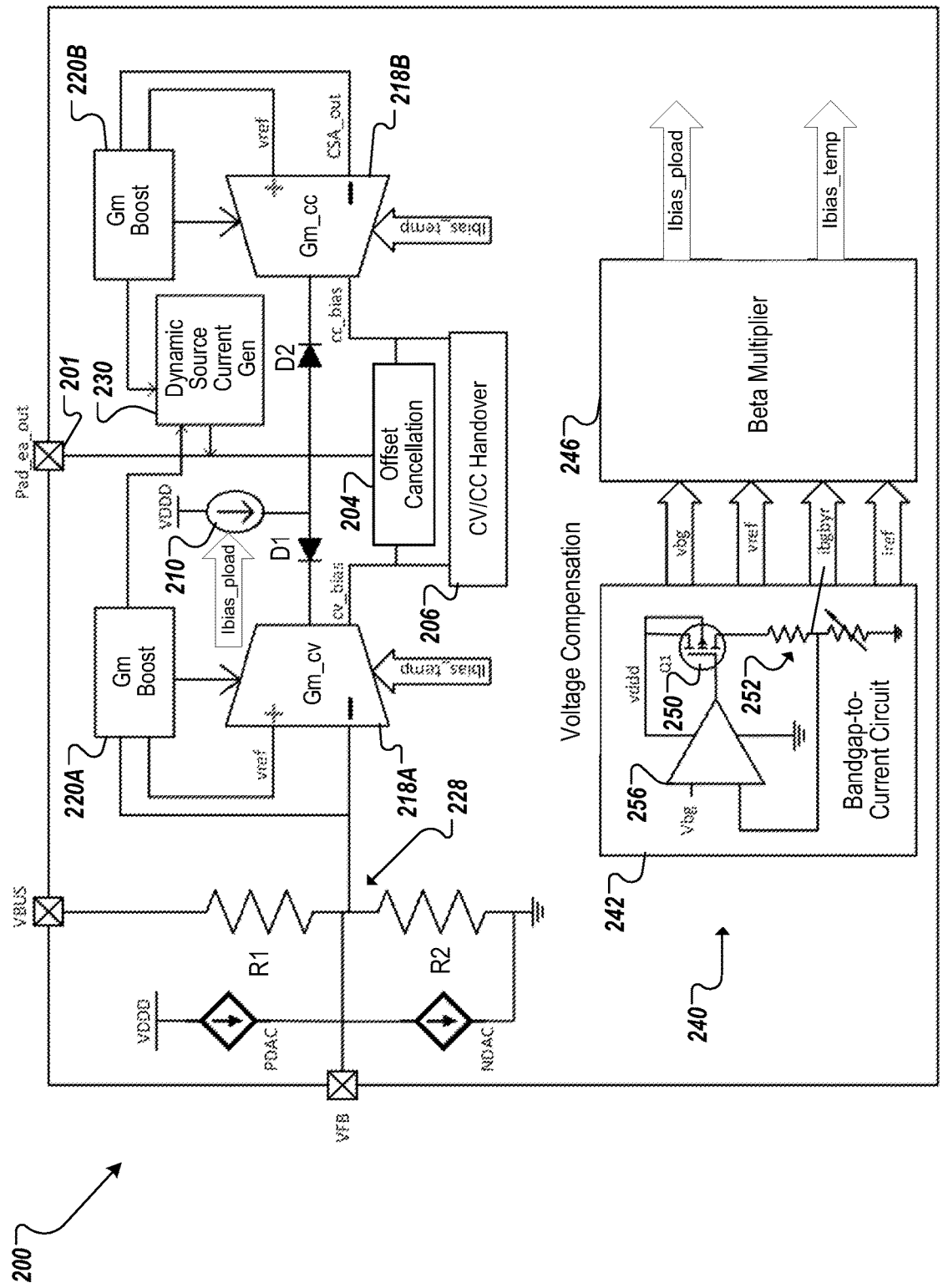
FIG. 2 is a schematic block diagram of an error amplifier of the USB controller of FIG. 1, which includes a pair of transconductance amplifiers according to at least one embodiment.

FIG. 2 is a schematic block diagram of an error amplifier (EA) 200 of the USB controller 100 of FIG. 1, which includes a pair of transconductance amplifiers according to at least one embodiment. The EA 200 can, for example, take the place of the EA 118 discussed with reference to FIG. 1. The pair of transconductance amplifiers include a first transconductance amplifier 218A to operate in a constant voltage mode (e.g., Gm_cv) and a second transconductance amplifier 218B to operate in a constant current mode (e.g., Gm_cc). In these embodiments, the EA 200 further includes a single output pin 201 through which to provide the output current, e.g., the EA signal 117 in FIG. 1, to the comparator 116. Because each Gm amplifier of the pair of Gm amplifiers provides a compensation current to the same output pin 201, the Gm for each of the first transconductance amplifier 218A and the second transconductance amplifier 218B can be made programmable (see FIGS. 3A-3B), enabling independent control on the bandwidth for each of the CV mode and the CC mode. Equalizations between the Gm amplifiers will also be discussed.

In at least some embodiments, the EA 200 includes a voltage divider 228 coupled between the voltage bus (Vbus) and ground of the USB controller 100 and which includes a first resistor (R1) and a second resistor (R2). The EA 200 includes tap point (VFB) pin between the first and second resistors of the voltage divider 228 as an output of the EA 200. In one embodiment, first resistor is 200KΩ and the second resistor is 34KΩ, although other values are envisioned. Further, a positive digital-analog-converter (PDAC) can be positioned between the supply voltage and the tap point pin, and a negative DAC (NDAC) can be positioned between the tap point pin and the ground.

In various embodiments, the EA 200 further includes offset cancellation circuitry 204 and CV/CC handover circuitry 206 coupled between output circuitry of the first transconductance amplifier 218A and a second transconductance amplifier 218B. The EA 200 can further include a current source 210 coupled between a supply voltage (Vddd) and the output pin 201, a first diode (D1) coupled between output pin and a first output of the first transconductance amplifier 218A, and a second diode (D2) coupled between the output pin 201 and a second output of the second transconductance amplifier 218B. The EA 200 can further include a first boost transconductance amplifier 220A coupled to the first transconductance amplifier 218A and a second boost transconductance amplifier 220B coupled to the second transconductance amplifier 218B, which will be discussed in more detail with reference to FIG. 6A. In at least some embodiments, the EA 200 further includes a dynamic source current generator 230 coupled between each of the first boost transconductance amplifier 220A and a second boost transconductance amplifier 220B and the output pin 201.

Each of these components that enhance functioning of the first and second transconductance amplifiers 218A and 218B in some way to overcome the above-mentioned deficiencies will be discussed in more detail. Not all components must be used in combination, as the different enhancements to the EA 200 that are discussed herein can be implemented alone or in combination with other enhancements and/or embodiments.

With more specificity, and in accordance with disclosed embodiments, the first transconductance amplifier 218A can adjust an output current at the output pin 201 depending on a difference (e.g., error) between voltages at a first positive input and at a second positive input. The first positive input receives a first voltage reference (Vref). The first negative input can be coupled to the tap point of a voltage divider coupled between a voltage bus and a ground of the buck-boost converter. Further, the second transconductance amplifier 218B can also adjust the output current at the output pin 201 depending on a difference (e.g., error) between voltages at a second positive input and at a second negative input. The second positive input receives a second voltage reference (Vref). The second negative input can be coupled to the current sense amplifier, e.g., the output CSA 130 (FIG. 1), which is coupled to a sense resistor positioned inline along the voltage bus (Vbus). Each voltage reference can be programmable and supplied by control logic such as the BB control 120 or other control logic.

Since an input offset is present at the input of each Gm amplifier, any temperature variation in Gm will result in the variation of Vbus voltage. A temperature compensation can be generated to track the Gm movement with load current which eliminates the Vbus movement due to Gm change with temperature. This temperature compensation can include generation of a current bias based on the temperature, e.g., which increases with temperature so that the Gm, determined by metal-oxide-semiconductor field-effect transistors (MOSFETs) of each Gm amplifier, remains substantially constant. The following formulas illustrate configuration of temperature compensation such that transconductance (Gm) can be programmed independent of temperature.

$$I_d = \frac{1}{2}\mu_n C_{ox} \frac{w}{l}(V_{gs} - V_{th})^2$$

$$G_m = \sqrt{2I_d \mu_n C_{ox} \frac{w}{l}}$$

$$I_{bias\_ptat} = \frac{1}{R^2} \frac{2}{\mu_n C_{ox}} \left(\sqrt{\frac{l1}{w1}} - \sqrt{\frac{l2}{w2}}\right)^2$$

$$G_m = \frac{2}{R}\left(\sqrt{\frac{l1}{w1}} - \sqrt{\frac{l2}{w2}}\right)\sqrt{\frac{w}{l}}$$

$$Iout = Gm * (vinp - vinn)$$

$$\Delta Iout(t) = \Delta Gm(t)$$

$$G_m = \frac{1}{R} * k1$$

$$Iout = \frac{k2}{R}$$

$$k1 = 2*\left(\sqrt{\frac{l1}{w1}} - \sqrt{\frac{l2}{w2}}\right)\sqrt{\frac{w}{l}} \quad k2 = vbg(\text{constant})$$

where the last equation indicates that k1 and k2 are constants with respect to temperature, e.g., are only dependent on the width-to-length ratio (w/l) of the MO SFET transistors employed in the Gm amplifiers.

Thus, in at least some embodiments, the EA 200 further includes a temperature compensation circuit 240, which can be used to generate a bias current of the EA 200 in way that Gm movement with temperature can be tracked with changes in load current, e.g., which maintains accuracy of the output current by tracking transconductance variation according to temperature-to-load-current variation. In these embodiments, the temperature compensation circuit 240 includes a bandgap-to-current circuit 242 to convert a bandgap voltage reference (Vbg) of the buck-boost converter 101 to a bandgap-dependent current (ibgbyr) and a beta multiplier 246 coupled to the bandgap-to-current circuit 242. The beta multiplier 246 can generate a load bias current (Ibias_pload), which is based on the bandgap-dependent current, to bias the current source 210 that is coupled to the output pin 201. The beta multiplier 246 can further generate, based on the illustrated inputs (e.g., the Vbg, Vref, Iref), a temperature-dependent bias current (Ibias_temp) to bias current output by at least one of the first transconductance amplifier 218A or the second transconductance amplifier 218B.

In one embodiment, the bandgap-to-current circuit 242 includes a metal-oxide-semiconductor field-effect transistor (MOSFET) 250 with a source coupled to the supply voltage (Vddd). The bandgap-to-current circuit 242 can further include a voltage divider 252 having a variable resistor and that is coupled between a drain of the MOSFET and the ground. The bandgap-to-current circuit 242 can further include a comparator 256 to drive a gate of the MOSFET based on inputs including the bandgap voltage (Vbg) and a middle tap point of the voltage divider. In some embodiments, the bandgap voltage reference (Vbg) is a recycled voltage that varies minimally (or not at all) with temperature, and is thus predictable and/or generally unchanging. The bandgap-dependent current (ibgbyr) can be understood to be proportional to the bandgap voltage after passing through the MOSFET 250 and the voltage divider 252, and thus the bandgap-to-current circuit 242 can be understood to be a current generator that mimics each Gm amplifier from a temperature perspective.

As illustrated, each Gm amplifier includes an input offset, e.g., Iout=Gm*(Vinp–Vinn), proportional to the output sourcing current and the transconductance (Gm). Since Gm cannot be infinite, a fixed offset is always present and can change with chip temperature. This degrades the accuracy of USB converter 100. In at least some embodiments, the offset cancellation circuitry 204 endeavors to eliminate the offset voltage at the input of each Gm amplifier.

In at least some embodiments, the offset cancellation circuitry 204 is to one of detect a first direct current (DC) voltage offset at an input of the first transconductance amplifier 218A while in CV mode or a second DC voltage offset at an input of the second transconductance amplifier 218B while in CC mode. In response to detection of the first DC offset, the offset cancellation circuitry 204 can sink a first equivalent current from the first transconductance amplifier 218A to cancel the first DC voltage offset, where the first equivalent current corresponds to a programmable transconductance of the first transconductance amplifier 218A. In response to detection of the second DC offset, offset cancellation circuitry 204 can sink a second equivalent current from the second transconductance amplifier 218B to cancel the second DC voltage offset, where the second equivalent current corresponds to a programmable transconductance of the second transconductance amplifier 218B. A more detailed illustration of the offset cancellation circuitry 204 is illustrated and discussed with reference to FIGS. 3A-3B.

Figure 6A:
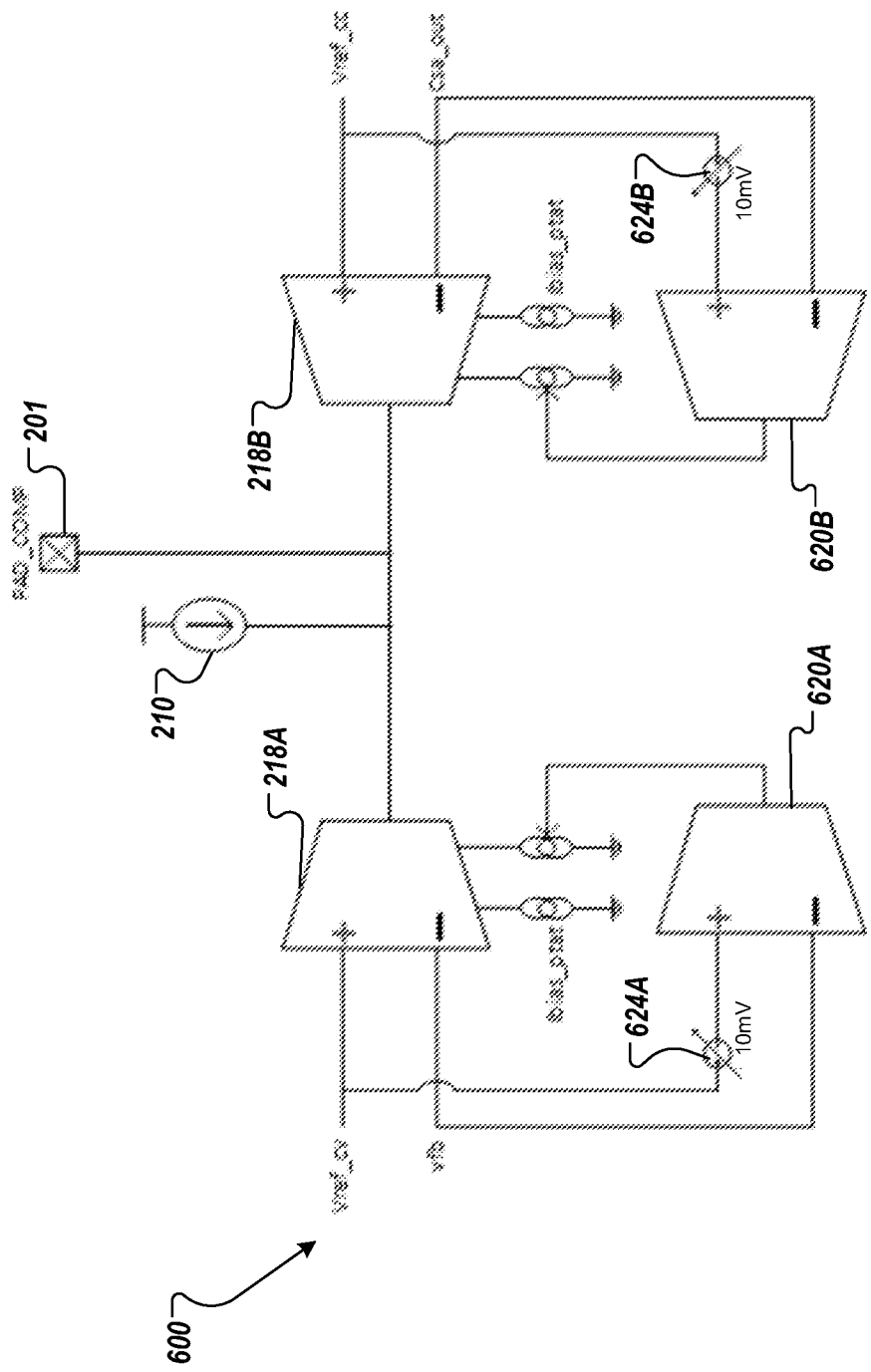
FIG. 6A is a schematic block diagram of transconductance boosting circuitry according to at least one embodiment.
Figure 6B:
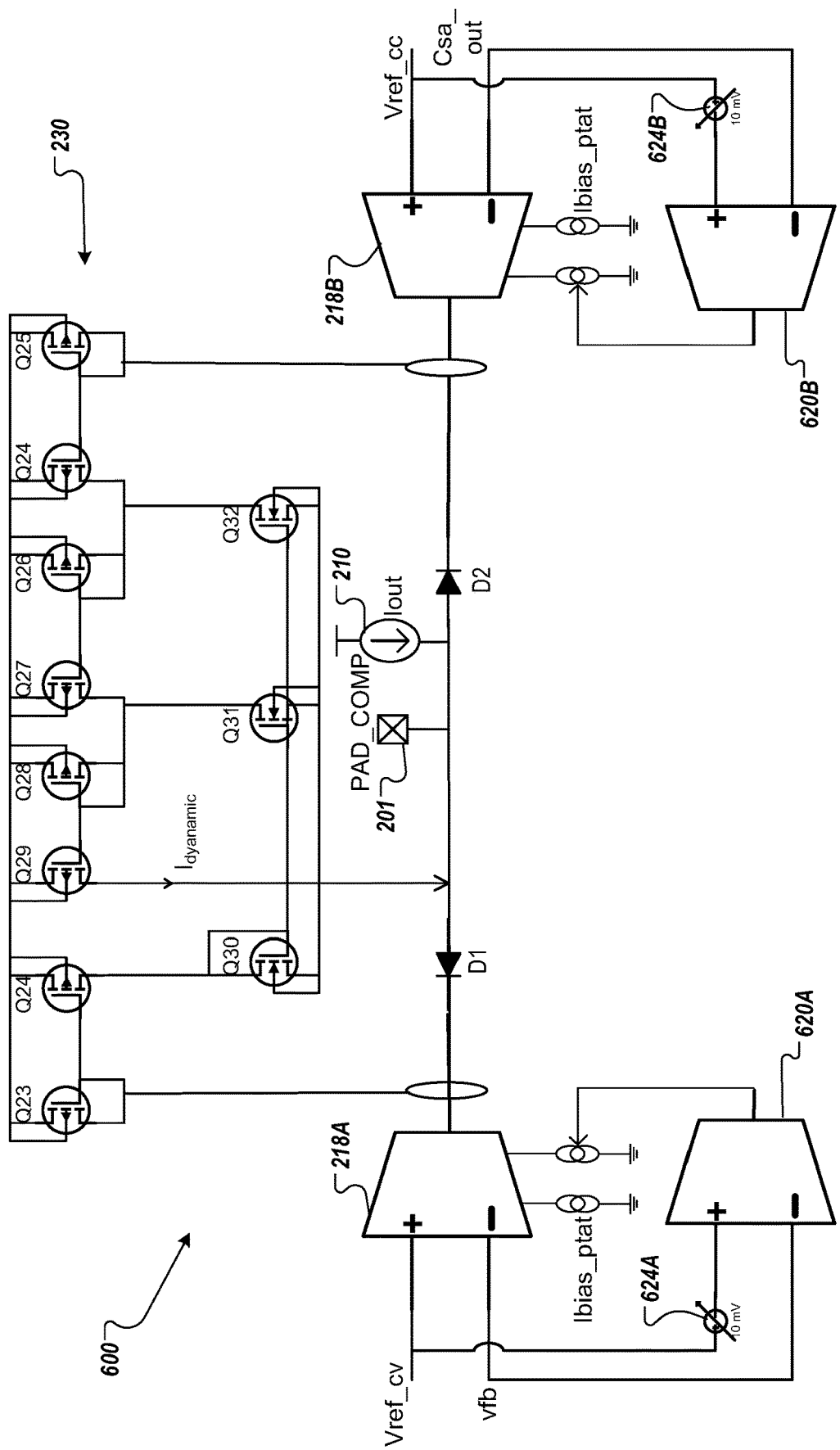
FIG. 6B is a schematic block diagram of FIG. 6A that also includes dynamic current sourcing circuitry according to at least one embodiment.

In at least some embodiments, the dynamic source current generator 230, which is discussed in more detail with reference to FIG. 6B, is to detect saturation of one of the first transconductance amplifier 218A or the second transconductance amplifier 218B. The dynamic source current generator 230 can then provide a source current to the output pin 201 in response to the saturation of the one of the first transconductance amplifier 218A or the second transconductance amplifier 218B. In some embodiments, the source current is proportional to an input difference of respective positive and negative inputs of the one of the first transconductance amplifier 218A or the second transconductance amplifier 218B that saturates.

In at least some embodiments, due to finite Gm in the Gm amplifiers, the switch over from CV to CC (or CC to CV) mode is not instantaneous as the EA 200 cannot go to zero current instantaneously. Thus, the USB converter 100 is forced to stay in an intermediate state where the USB converter 100 is not in either CV mode or CC mode. The CV/CC handover circuitry 206 is configured to ensure that the USB converter 100 stays in either CV or CC mode depending on the input differences between the first and second transconductance amplifiers 218A and 218C. In some embodiments, the CV/CC handover circuitry 206 includes a minimum current generator that will be discussed with reference to FIGS. 5A-5B.

Figure 3A:
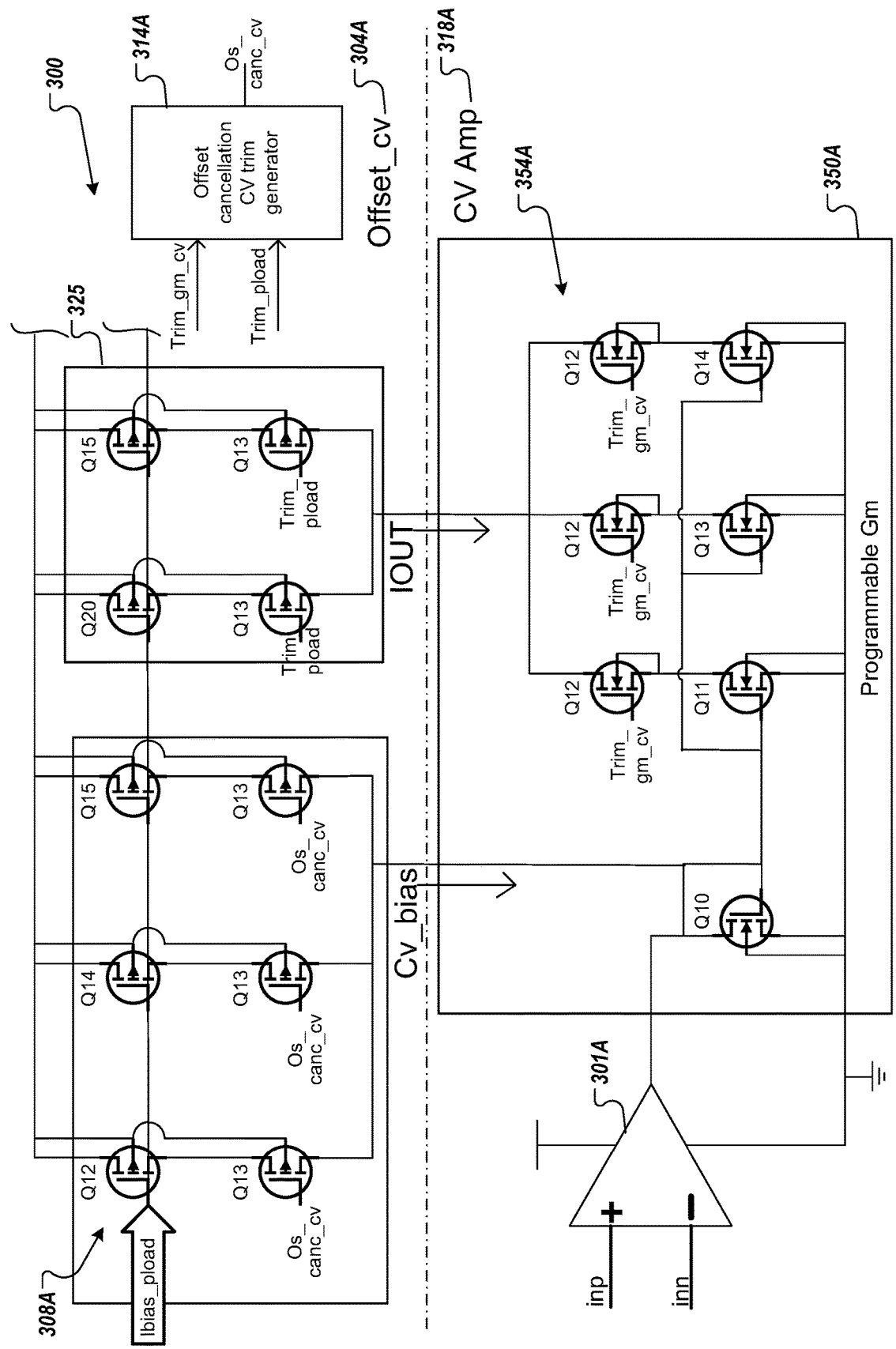
FIGS. 3A-3B are schematic block diagrams of offset cancellation circuitry and programmable transconductance circuitry of the error amplifier according to at least one embodiment.
Figure 3B:
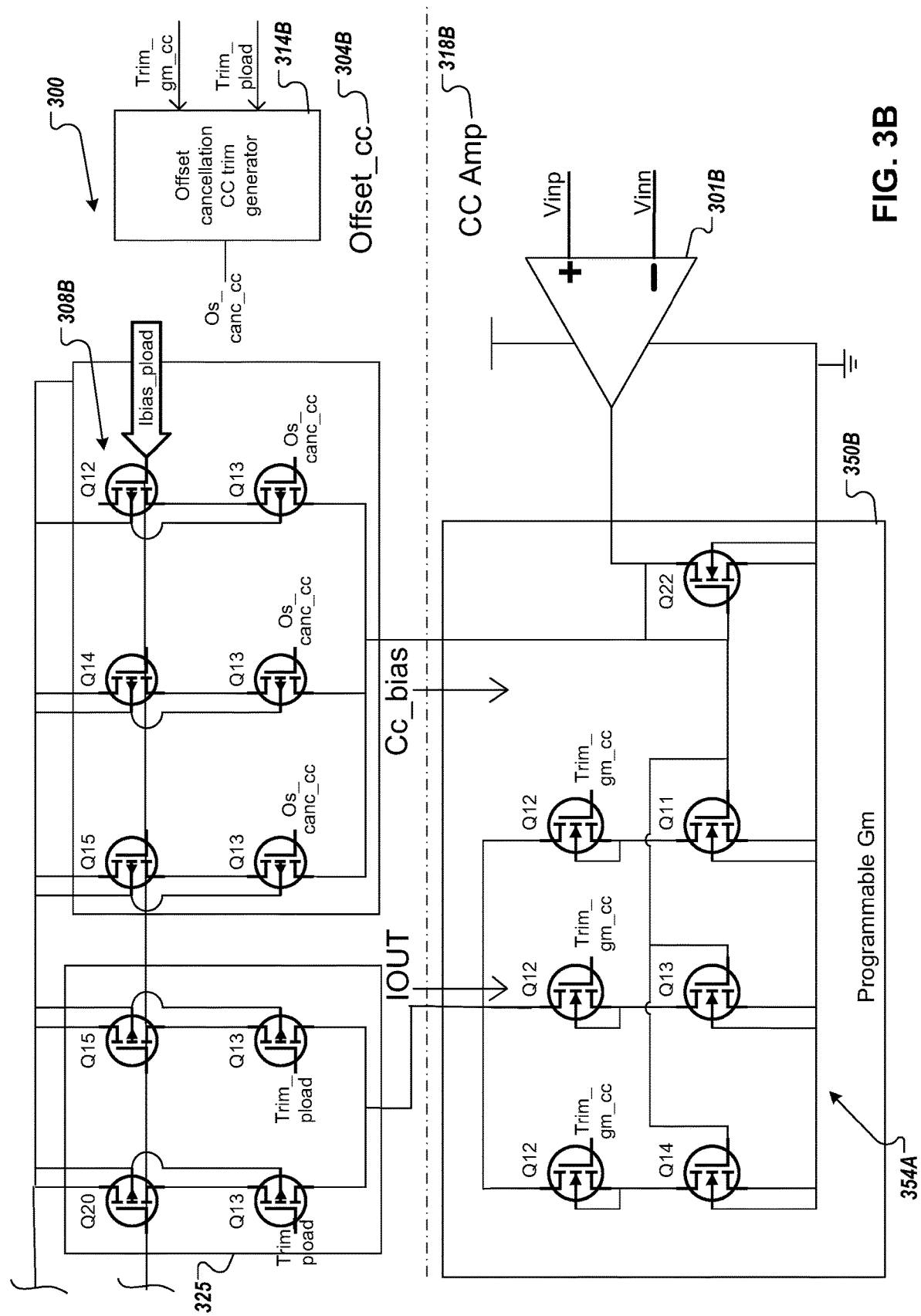

FIGS. 3A-3B are schematic block diagrams of offset cancellation circuitry 300 and programmable transconductance circuitry of the error amplifier 200 according to at least one embodiment. While FIG. 3A illustrates constant current offset cancellation circuitry 304A to cancel an input offset of a constant voltage (or first) Gm amplifier 318A, FIG. 3B illustrates constant voltage offset cancellation circuitry 304B to cancel an input offset of a constant current (or second) Gm amplifier 318B. In some embodiments, the offset cancellation circuitry 300 can be the offset cancellation circuitry 204 of the EA 200 of FIG. 2. In these embodiments, the offset cancellation circuitry 300 can create a zero offset at the input of each of the first and second Gm amplifiers 318A and 318B based on a steady state source current. For example, the offset cancellation circuitry 300 can eliminate a DC voltage offset at the input of the EA 200 by sinking the current equivalent to the source current from either the first Gm amplifier 318A or the second Gm amplifier 318B based on the mode of the loop at the time of cancellations, e.g., CV mode or CC mode, respectively.

In these embodiments, the first Gm amplifier 318A includes an operational amplifier 301A having an output coupled to a programmable transconductance (Gm) circuit 350A (FIG. 3A), and the second Gm amplifier 318B includes an operational amplifier 301B having an output coupled to a programmable transconductance (Gm) circuit 350B (FIG. 3B). In some embodiments, each programmable Gm circuit 350A and 350B includes a bank of n-channel MOSFETs 354A (or 354B), respectively, in which a gate of at least some of the n-channel MOSFETs are coupled to control logic to be trimmed in order to adjust an output current supplied to the output pin. For example, the gate of the Q12 MOSFETs can receive the trim gm cv signal for the first programmable Gm circuit 350A or the trim gm cc signal for the second programmable Gm circuit 350B. An output n-channel MOSFET (Q10 or Q22) can include a drain coupled to the output of the operational amplifier 301A or 301B, respectively, and a source that is grounded. A gate of the output n-channel MOSFET can then be connected to the drain of the output n-channel MOSFET and to gates of additional n-channel MOSFETs that are coupled in in series to the Q12 MOSFETs within the bank of MOSFETs 354A or 354B.

With additional reference to FIG. 3A and FIG. 3B, the offset cancellation circuitry 300 includes constant voltage (CV) offset cancellation circuitry 304A and constant current (CC) offset cancellation circuitry 304B, each that commonly connect to an output module 325 of the offset cancellation circuitry 300. In these embodiments, the CV offset cancellation circuitry 304A of FIG. 3A includes an offset cancellation CV trim generator 314A that generates an offset cancellation signal (Os_canc_cv) based on trim signals received from control logic, e.g., from trim_gm_cv and trim_pload signals that perform the Gm programming. The CV offset cancellation circuitry 304A can further include a bank of parallel-connected sets of p-channel MOSFETs 308A, where a bottom set of serially-connected p-channel MOSFETs (Q13s) of the bank of p-channel MOSFETs 308A have gates driven by the offset cancellation signal. The drains of this bottom set of serially-connected p-channel MOSFETs can generate a CV bias current (cv_bias) that is fed to the gate of the output MOSFET Q10 of the first programmable Gm circuit 350A to impart an offset cancellation current. The gate of at least one of the top set of serially-connected p-channel MOSFETs (Q12, Q14, and Q15) receives the load bias current (Ibias_pload) previously discussed.

In these embodiments, the CC offset cancellation circuitry 304B of FIG. 3B includes an offset cancellation CC trim generator 314B that generates an offset cancellation signal (Os_canc_cc) based on trim signals received from control logic, e.g., from trim_gm_cc and trim_pload signals that perform the Gm programming. More specifically, the Os_canc_cv and Os_canc_cc signals are digital signals, which will turn on only some of the MOSFETs, allowing different current flow for different Gm and load current for offset cancellation.

In various embodiments, the CC offset cancellation circuitry 304B further includes a bank of parallel-connected sets of p-channel MOSFETs 308B, where a bottom set of serially-connected p-channel MOSFETs of the bank of n-channel MOSFETs 308B have gates driven by the offset cancellation signal. The drains of this bottom set of serially-connected p-channel MOSFETs can generate a CC bias current (cc_bias) that is fed to the gate of the output MOSFET Q22 of the second programmable Gm circuit 350B to impart an offset cancellation current. The gate of at least one of the top set of serially-connected p-channel MOSFETs (Q12, Q14, and Q15) receives the load bias current (Ibias_pload) previously discussed.

In at least some embodiments, the output module 325 includes a further set of parallel-connected p-channel MOSFETs, where a bottom pair of serially-connected p-channel MOSFETs (Q13s) have gates that receive the trim pload (trim_pload) signal and a drain that outputs an output current (IOUT). This output current feeds the drains of the trim-controlled n-channel MOSFETs (Q12s) of the first and second programmable Gm circuits 350A and 350B. In this way, the output module 325 further controls the input current to the bank of the n-channel MOSFETs 354A and 354B of each of the first and second programmable Gm circuits 350A and 350B, respectively.

FIG. 4A is a graph illustrating an overlap region 402 for a constant voltage (CV) and constant current (CC) feedback control loops. This overlap region exists at the boundary between CV and CC control, where the depth of this boundary depends on the gm of the EA 200 and the load current. A first line 404 illustrates current sunk by the CV transconductance amplifier 218A and a second line 406 illustrates current sunk by the CC transconductance amplifier 218B.

FIG. 4B is a graph illustrating elimination of the overlap region 402 using a minimum current generator of the error amplifier 200 that sources a minimum current back to a common error amplifier node according to an embodiment. This minimum current generator can be located within the CV/CC handover circuitry 206 and will be discussed with reference to FIGS. 5A-5B. The values on the graphs of FIGS. 4A-4B are merely exemplary and are not meant to be limiting.

Figure 5A:
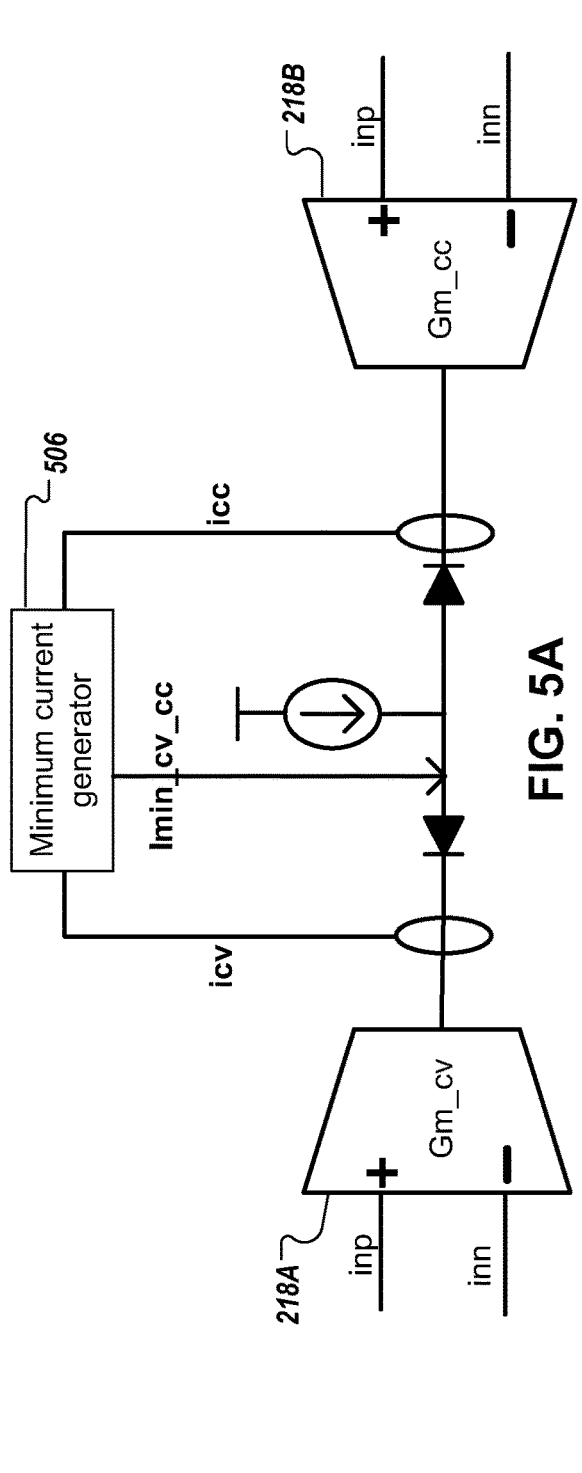
FIG. 5A is a schematic block diagram illustrating functionality of a minimum current generator according to at least one embodiment.

FIG. 5A is a schematic block diagram illustrating functionality of a minimum current generator 506, which as mentioned, can be included in the CV/CC handover circuitry 206 according to at least one embodiment. The minimum current generator 506 can include current inputs from the first output of the first transconductance amplifier 218A (e.g., the CV current) and the second output of the second transconductance amplifier 218B (e.g., the CC current). The minimum current generator 506 can then determine a minimum current between the first output and the second output and supply the minimum current to the output pin 201.

Figure 5B:
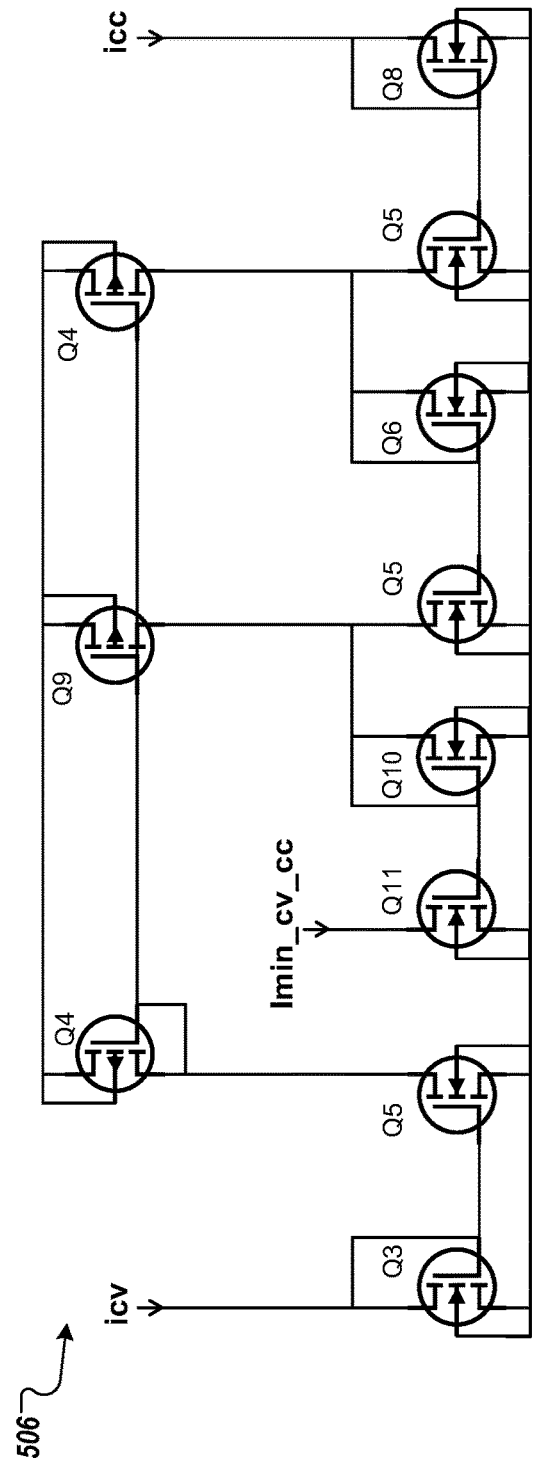
FIG. 5B is a schematic block diagram of an implementation of the minimum current generator according to at least one embodiment.

FIG. 5B is a schematic block diagram of an implementation of the minimum current generator 506 according to at least one embodiment. The minimum current generator 506 in this embodiment includes an n-channel MOSFET (Q3) to receive the CV current (icv) and another n-channel MOSFET (Q8) to receive the CC current (icc). The current through the Q3 MOSFET can be mirrored to another n-channel MOSFET (Q5) and the current of the Q8 MOSFET can be mirrored to another n-channel MOSFET (Q5) as well. Additional current mirrors using p-channel and n-channel MOSFETs can be employed as illustrated to compare the CV and CC currents, and to output the minimum of the CV and CC currents at Imin_cv_cc. In these embodiments, this minimum current, when supplied, ensures that either the first transconductance amplifier 218A or the second transconductance amplifier 218B supplies the current to the output pin 201 and there is no simultaneous operation in the overlap region, e.g., as per FIG. 4B. The implementation of the minimum current generator 506 is exemplary, and thus other or different implementations are envisioned.

FIG. 6A is a schematic block diagram of transconductance boosting circuitry 600A according to at least one embodiment, and which makes additional reference back to the EA 200 of FIG. 2. A transconductance boosting technique can be employed to increase the Gm of EA 200, thereby increasing the system bandwidth when the input error of the EA 200 is large, e.g., into the "Imax" region of the graph of FIG. 7. In some USB controllers, boosting starts to happen when the Vbus voltage deviates from a threshold target voltage by 100 mV, for example, or some other programmable threshold target deviation voltage. This helps in improving the transient response of the system.

In at least some embodiments, a first boost transconductance amplifier 620A is to receive, as inputs, the first positive input and the first negative input of the first transconductance amplifier 218A, and to supply an adjustment in output current to the first transconductance amplifier 218A proportional to a first difference between the first positive input and the first negative input. In these embodiments, a second boost transconductance amplifier 620B is to receive, as inputs, the second positive input and the second negative input of the first transconductance amplifier 218B, and to supply an adjustment in output current to the second transconductance amplifier 218B proportional to a second difference between the second positive input and the second negative input. In general, the greater the error between inputs of one of the Gm amplifiers, the greater the adjustment by a respective boost transconductance amplifier.

In some embodiments, a threshold minimum voltage source 624A and 624B is supplied to each of the first and second positive inputs of the first boost transconductance amplifier 218A and the second boost transconductance amplifier 218B, respectively, to provide a minimum starting point for current boosting. A value of the threshold minimum voltage source 624A and 624B can be, for example, between 5-20 millivolts (mV). In one embodiment, the value of the threshold minimum voltage source 624A and 624B is 10 mV, as illustrated.

FIG. 6B is a schematic block diagram of FIG. 6A that also includes the dynamic current sourcing circuitry 230, also illustrated in FIG. 2, according to at least one embodiment. In at least some embodiments, the dynamic current circuitry 230 is coupled to each of the first boost transconductance amplifier 218A and the second boost transconductance amplifier 218B as well as to the output pin 201. The implementation illustrated for the dynamic source current generator 230 is exemplary, as additional or different implementations are envisioned. The dynamic source current generator 230 can be adapted to detect saturation of one of the first transconductance amplifier 218A or the second transconductance amplifier 218B, e.g., via p-channel MOSFETs Q23 and Q25, respectively. Saturation may occur once a fixed output source current is exceeded.

For example, a drain of the Q23 MOSFET can be coupled to the output of the first transconductance amplifier 218A to detect saturation of the first transconductance amplifier 218A. Further, a drain of the Q25 MOSFET can be coupled to the output of the second transconductance amplifier 218B to detect saturation of the second transconductance amplifier 218B.

In at least some embodiments, the dynamic source current generator 230 is further adapted to provide a source current to the output pin 201 in response to the saturation of the one of the first transconductance amplifier 218A or the second transconductance amplifier 218B. In at least some embodiments, the source current is proportional to an input difference of respective positive and negative inputs of the one of the first transconductance amplifier 218A or the second transconductance amplifier 218B that saturates. To do so, the dynamic source current generator 230 can include a number of current mirrors employing additional p-channel MOSFETs, where an output of each current mirror is received by an n-channel MOSFET. A final comparative p-channel MOSFET (Q29) can output, from its drain, the dynamic source current ($I_{dynamic}$). In this way, the larger the input difference to a Gm amplifier, the more source current that can be separately supplied by the dynamic source current generator 230 to avoid the saturation of the EA 200.

Figure 7:
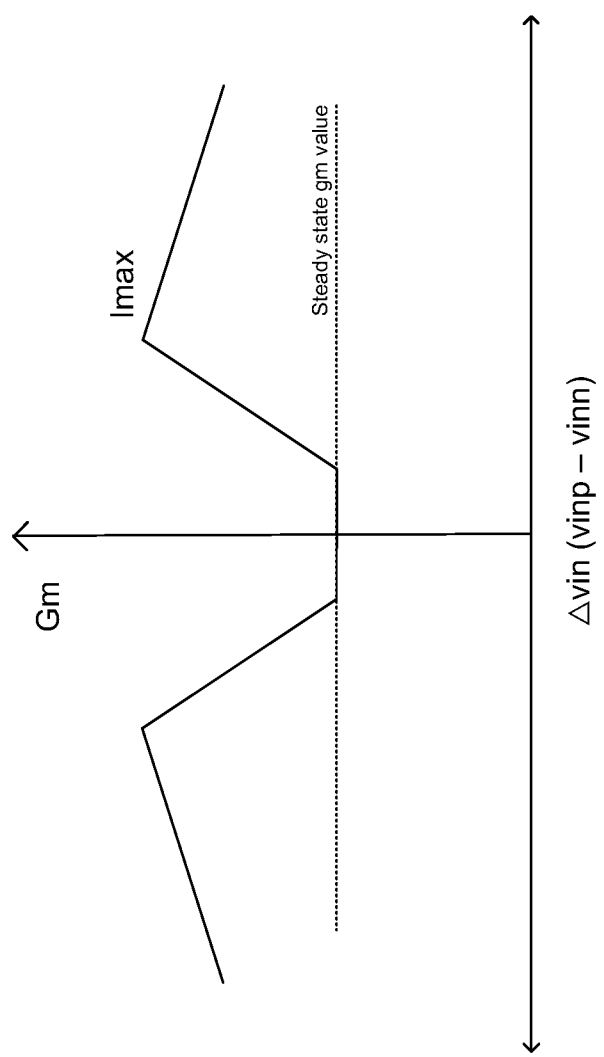
FIG. 7 is a graph that illustrates functionality of the dynamic current sourcing circuitry according to at least one embodiment.

FIG. 7 is a graph that illustrates functionality of the dynamic current sourcing circuitry according to at least one embodiment. This graph illustrates a constant transconductance (Gm) until the error at the input a transconductance amplifier (e.g., 218A or 218B) as long as the threshold set by the threshold minimum voltage source 624A or 624B, respectively, is not exceeded. Once the error exceeds a value of the threshold minimum voltage source, the threshold Gm increases due to Gm boosting until the transconductance amplifier reaches a high enough current value. At some point, the input voltage difference reaches a natural saturation where the source current of the EA 200 hits a maximum value (Imax). The Gm is then lowered as the source current continues into saturation. It can be observed that the EA 200 does not saturate quickly and maintains control for a wider input range. Accordingly, the boosting and dynamic source current generator 230 can be employed to avoid or delay such saturation.

Figure 8:
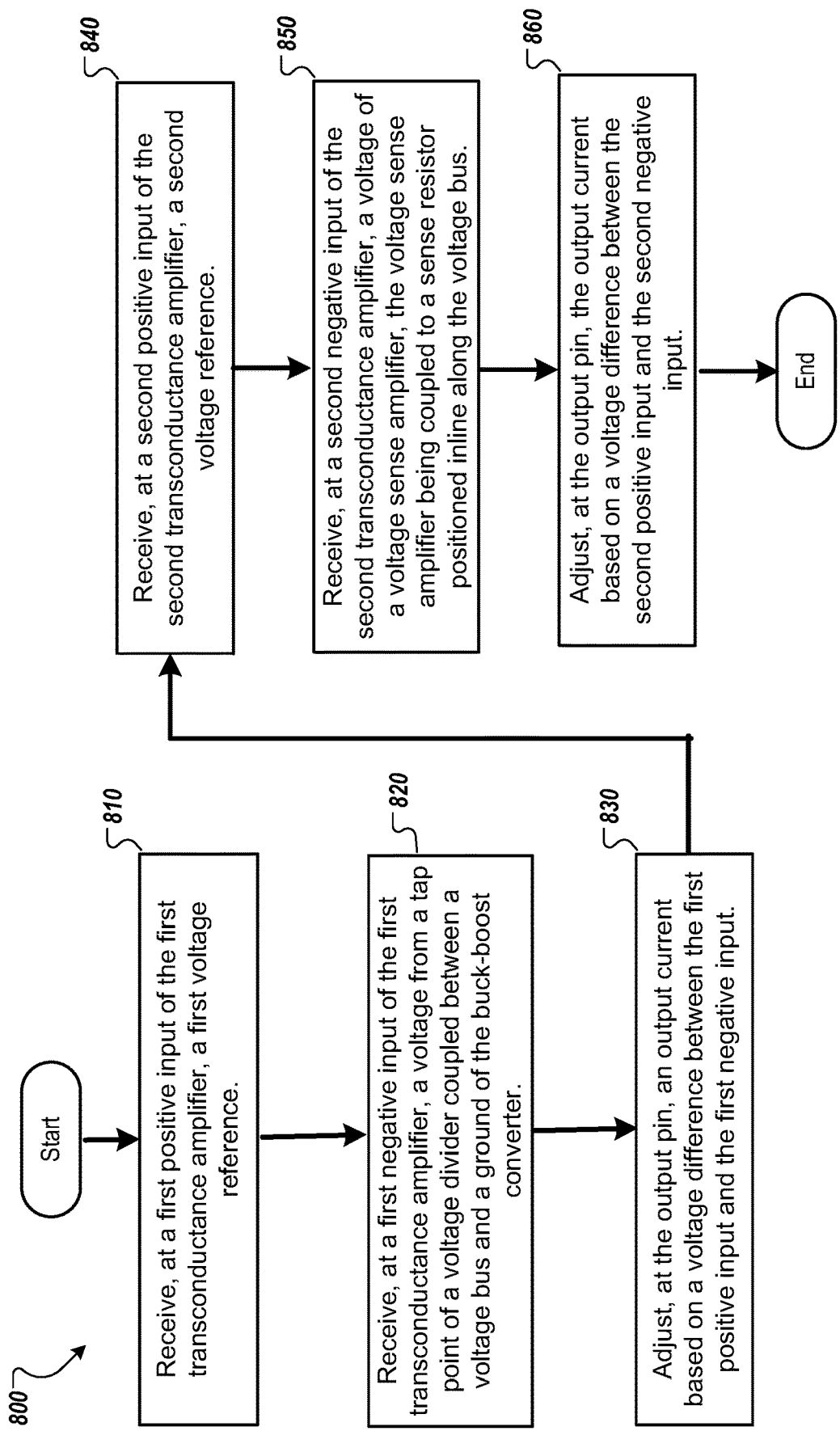
FIG. 8 is a flow diagram of a method of operating an error amplifier according to at least some of the disclosed embodiments.

FIG. 8 is a flow diagram of a method 800 of operating an error amplifier according to at least some of the disclosed embodiments. The method 800 can be performed by the EA 200 and other associated components of the EA 200 described herein with reference to FIGS. 2-7.

At operation 810, the EA 200 receives, at a first positive input of the first transconductance amplifier 218A, a first voltage reference.

At operation 820, the EA 200 receives, at a first negative input of the first transconductance amplifier 218A, a voltage from a tap point of a voltage divider coupled between a voltage bus and a ground of the buck-boost converter.

At operation 830, the EA 200 adjusts, at the output pin, an output current based on a voltage difference between the first positive input and the first negative input.

At operation 840, the EA 200 receives, at a second positive input of the second transconductance amplifier, a second voltage reference.

At operation 850, the EA 200 receives, at a second negative input of the second transconductance amplifier, a voltage of a current sense amplifier, the current sense amplifier being coupled to a sense resistor positioned inline along the voltage bus.

At operation 860, the EA 200 adjusts, at the output pin, the output current based on a voltage difference between the second positive input and the second negative input.

Various embodiments of the transconductance amplifiers for buck-boost converters within USB-C controllers (or other related converters) described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for the techniques described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An error amplifier comprising:
   an output pin coupled to a pulse width modulation (PWM) comparator of a buck-boost converter;
   a first transconductance amplifier to adjust an output current at the output pin, wherein the first transconductance amplifier operates in a constant voltage mode and comprises:
     a first positive input to receive a first voltage reference; and
     a first negative input coupled to a tap point of a voltage divider coupled between a voltage bus and a ground of the buck-boost converter;
   a second transconductance amplifier to also adjust the output current at the output pin, wherein the second transconductance amplifier operates in a constant current mode and comprises:
     a second positive input to receive a second voltage reference; and
     a second negative input coupled to a current sense amplifier, the current sense amplifier being coupled to a sense resistor positioned inline along the voltage bus.

2. The error amplifier of claim 1, further comprising a temperature compensation circuit to maintain accuracy of the output current by tracking transconductance variation according to temperature-to-load-current variation, the temperature compensation circuit comprising:
   a bandgap-to-current circuit to convert a bandgap voltage reference of the buck-boost converter to a bandgap-dependent current; and
   a beta multiplier coupled to the bandgap-to-current circuit, the beta multiplier to:
     generate a load bias current, which is based on the bandgap-dependent current, to bias a current source that is coupled to the output pin; and
     generate a temperature-dependent bias current to bias current output by at least one of the first transconductance amplifier or the second transconductance amplifier.

3. The error amplifier of claim 2, wherein the bandgap-to-current circuit comprises:
   a metal-oxide-semiconductor field-effect transistor (MOSFET) with a source coupled to a supply voltage;
   a voltage divider having a variable resistor and that is coupled between a drain of the MOSFET and the ground; and
   a comparator to drive a gate of the MOSFET based on inputs comprising the bandgap voltage and a middle tap point of the voltage divider.

4. The error amplifier of claim 1, further comprising an offset cancellation circuitry coupled to outputs of the first transconductance amplifier and the second transconductance amplifier, the offset cancellation circuitry to:
   one of detect a first direct current (DC) voltage offset at an input of the first transconductance amplifier while in the constant voltage mode or a second DC voltage offset at an input of the second transconductance amplifier while in the constant current mode;
   in response to detection of the first DC offset, sink a first equivalent current from the first transconductance amplifier to cancel the first DC voltage offset, wherein the first equivalent current corresponds to a programmable transconductance of the first transconductance amplifier; and
   in response to detection of the second DC offset, sink a second equivalent current from the second transconductance amplifier to cancel the second DC voltage offset, wherein the second equivalent current corresponds to a programmable transconductance of the second transconductance amplifier.

5. The error amplifier of claim 1, further comprising:
   a current source coupled between a supply voltage and the output pin;
   a first diode coupled between output pin and a first output of the first transconductance amplifier;
   a second diode coupled between the output pin and a second output of the second transconductance amplifier; and
   a minimum current generator having current inputs from the first output and the second output and an output connected to the output pin, the minimum current generator to:
     determine a minimum current between the first output and the second output; and
     supply the minimum current to the output pin.

6. The error amplifier of claim 1, further comprising a programmable transconductance circuit coupled to an output of at least one of the first transconductance amplifier or the second transconductance amplifier, wherein the programmable transconductance circuit comprises a bank of MOSFETs in which a gate of at least some of the MOSFETs are coupled to control logic to be trimmed in order to adjust an output current supplied to the output pin.

7. The error amplifier of claim 1, further comprising:
a first boost transconductance amplifier to receive, as inputs, the first positive input and the first negative input of the first transconductance amplifier, and to supply an adjustment in output current to the first transconductance amplifier proportional to a first difference between the first positive input and the first negative input; and
a second boost transconductance amplifier to receive, as inputs, the second positive input and the second negative input of the first transconductance amplifier, and to supply an adjustment in output current to the second transconductance amplifier proportional to a second difference between the second positive input and the second negative input.

8. The error amplifier of claim 7, wherein a threshold minimum voltage source is supplied on each of the first and second positive inputs of the first boost transconductance amplifier and the second boost transconductance amplifier, respectively, to provide a minimum starting point for boosting.

9. The error amplifier of claim 7, further comprising a dynamic source current generator coupled to each of the first boost transconductance amplifier and the second boost transconductance amplifier, the dynamic source current generator to:
detect saturation of one of the first transconductance amplifier or the second transconductance amplifier; and
provide a source current to the output pin in response to the saturation of the one of the first transconductance amplifier or the second transconductance amplifier, the source current being proportional to an input difference of respective positive and negative inputs of the one of the first transconductance amplifier or the second transconductance amplifier that saturates.

10. An integrated circuit (IC) controller for a Universal Serial Bus (USB) Type-C device, the IC controller comprising:
a buck-boost converter to switch an output voltage of a voltage bus of the USB Type-C device that can swing up to at least 24 volts; and
an error amplifier coupled between an output and an input of the buck-boost converter, wherein the error amplifier comprises:
an output pin coupled to a pulse width modulation (PWM) comparator of the buck-boost converter;
a first transconductance amplifier to adjust an output current at the output pin, wherein the first transconductance amplifier operates in a constant voltage mode and comprises:
a first positive input to receive a first voltage reference; and
a first negative input coupled to a tap point of a voltage divider coupled between a voltage bus and a ground of the buck-boost converter;
a second transconductance amplifier to also adjust the output current at the output pin, wherein the second transconductance amplifier operates in a constant current mode and comprises:
a second positive input to receive a second voltage reference; and
a second negative input coupled to a current sense amplifier, the current sense amplifier being coupled to a sense resistor positioned inline along the voltage bus.

11. The IC controller of claim 10, wherein the error amplifier further comprises a temperature compensation circuit to maintain accuracy of the output current by tracking transconductance variation according to temperature-to-load-current variation, the temperature compensation circuit comprising:
a bandgap-to-current circuit to convert a bandgap voltage reference of the buck-boost converter to a bandgap-dependent current; and
a beta multiplier coupled to the bandgap-to-current circuit, the beta multiplier to:
generate a load bias current, which is based on the bandgap-dependent current, to bias a current source that is coupled to the output pin; and
generate a temperature-dependent bias current to bias current output by at least one of the first transconductance amplifier or the second transconductance amplifier.

12. The IC controller of claim 11, wherein the bandgap-to-current circuit comprises:
a metal-oxide-semiconductor field-effect transistor (MOSFET) with a source coupled to a supply voltage;
a voltage divider having a variable resistor and that is coupled between a drain of the MOSFET and the ground; and
a comparator to drive a gate of the MOSFET based on inputs comprising the bandgap voltage and a middle tap point of the voltage divider.

13. The IC controller of claim 10, wherein the error amplifier further comprises offset cancellation circuitry coupled to outputs of the first transconductance amplifier and the second transconductance amplifier, the offset cancellation circuitry to:
one of detect a first direct current (DC) voltage offset at an input of the first transconductance amplifier while in the constant voltage mode or a second DC voltage offset at an input of the second transconductance amplifier while in the constant current mode;
in response to detection of the first DC offset, sink a first equivalent current from the first transconductance amplifier to cancel the first DC voltage offset, wherein the first equivalent current corresponds to a programmable transconductance of the first transconductance amplifier; and
in response to detection of the second DC offset, sink a second equivalent current from the second transconductance amplifier to cancel the second DC voltage offset, wherein the second equivalent current corresponds to a programmable transconductance of the second transconductance amplifier.

14. The IC controller of claim 10, wherein the error amplifier further comprises:
a current source coupled between a supply voltage and the output pin;
a first diode coupled between output pin and a first output of the first transconductance amplifier;
a second diode coupled between the output pin and a second output of the second transconductance amplifier; and
a minimum current generator having current inputs from the first output and the second output and an output connected to the output pin, the minimum current generator to:
determine a minimum current between the first output and the second output; and
supply the minimum current.

15. The IC controller of claim 10, further comprising a programmable transconductance circuit coupled to an output of at least one of the first transconductance amplifier or the second transconductance amplifier, wherein the programmable transconductance circuit comprises a bank of MOSFETs in which a gate of at least some of the MOSFETs are coupled to control logic to be trimmed in order to adjust an output current supplied to the output pin.

16. The IC controller of claim 10, wherein the error amplifier further comprises:
 a first boost transconductance amplifier to receive, as inputs, the first positive input and the first negative input of the first transconductance amplifier, and to supply an adjustment in output current to the first transconductance amplifier proportional to a first difference between the first positive input and the first negative input; and
 a second boost transconductance amplifier to receive, as inputs, the second positive input and the second negative input of the first transconductance amplifier, and to supply an adjustment in output current to the second transconductance amplifier proportional to a second difference between the second positive input and the second negative input.

17. The IC controller of claim 16, wherein a threshold minimum voltage source is supplied on each of the first and second positive inputs of the first boost transconductance amplifier and the second boost transconductance amplifier, respectively, to provide a minimum starting point for boosting.

18. The IC controller of claim 16, wherein the error amplifier further comprises a dynamic source current generator coupled to each of the first boost transconductance amplifier and the second boost transconductance amplifier, the dynamic source current generator to:
 detect saturation of one of the first transconductance amplifier or the second transconductance amplifier; and
 provide a source current to the output pin in response to the saturation of the one of the first transconductance amplifier or the second transconductance amplifier, the source current being proportional to an input difference of respective positive and negative inputs of the one of the first transconductance amplifier or the second transconductance amplifier that saturates.

19. A method of operating an error amplifier that comprises an output pin coupled to a pulse width modulation (PWM) comparator of a buck-boost converter, a first transconductance amplifier that operates in a constant voltage mode, a second transconductance amplifier that operates in a constant current mode, wherein the method of operating the error amplifier comprises:
 receiving, at a first positive input of the first transconductance amplifier, a first voltage reference;
 receiving, at a first negative input of the first transconductance amplifier, a voltage from a tap point of a voltage divider coupled between a voltage bus and a ground of the buck-boost converter;
 adjusting, at the output pin, an output current based on a voltage difference between the first positive input and the first negative input;
 receiving, at a second positive input of the second transconductance amplifier, a second voltage reference;
 receiving, at a second negative input of the second transconductance amplifier, a voltage of a current sense amplifier, the current sense amplifier being coupled to a sense resistor positioned inline along the voltage bus; and
 adjusting, at the output pin, the output current based on a voltage difference between the second positive input and the second negative input.

20. The method of claim 19, wherein the error amplifier further comprises a temperature compensation circuit, and the method of operating the error amplifier further comprises maintaining accuracy of the output current by tracking transconductance variation according to temperature-to-load-current variation.

\* \* \* \* \*